United States Patent
Gabl

(10) Patent No.: US 9,252,351 B2
(45) Date of Patent: Feb. 2, 2016

(54) ACTUATOR AND METHOD FOR PRODUCING SAME

(75) Inventor: Reinhard Gabl, Kufstein (AT)

(73) Assignee: EPCOS AG, Munich (DE)

(*) Notice: Subject to any disclaimer, the term of this patent is extended or adjusted under 35 U.S.C. 154(b) by 94 days.

(21) Appl. No.: 13/996,482

(22) PCT Filed: Dec. 15, 2011

(86) PCT No.: PCT/EP2011/072960
§ 371 (c)(1),
(2), (4) Date: Sep. 19, 2013

(87) PCT Pub. No.: WO2012/084694
PCT Pub. Date: Jun. 28, 2012

(65) Prior Publication Data
US 2014/0009034 A1    Jan. 9, 2014

(30) Foreign Application Priority Data
Dec. 23, 2010 (DE) .......................... 10 2010 055 934

(51) Int. Cl.
| | | |
|---|---|---|
| H01L 41/047 | (2006.01) | |
| H01L 41/04 | (2006.01) | |
| H01L 41/083 | (2006.01) | |
| H01L 41/273 | (2013.01) | |
| H01L 41/08 | (2006.01) | |

(52) U.S. Cl.
CPC .............. *H01L 41/04* (2013.01); *H01L 41/083* (2013.01); *H01L 41/0825* (2013.01); *H01L 41/273* (2013.01)

(58) Field of Classification Search
CPC ..... H01L 41/04; H01L 41/083; H01L 41/273; H01L 41/0825
USPC .......................... 310/365, 366, 364, 341, 328
IPC ....................................................... H01L 41/047
See application file for complete search history.

(56) References Cited

U.S. PATENT DOCUMENTS

| | | | |
|---|---|---|---|
| 5,365,140 A | 11/1994 | Ohya et al. | |
| 5,436,494 A * | 7/1995 | Moslehi | 257/467 |
| 6,897,418 B1 * | 5/2005 | Gunther | 219/543 |
| 2003/0071328 A1 | 4/2003 | Boecking | |
| 2003/0160544 A1 | 8/2003 | Riedel et al. | |
| 2012/0090409 A1 * | 4/2012 | Luthje et al. | 73/862.627 |

FOREIGN PATENT DOCUMENTS

| | | |
|---|---|---|
| DE | 69308512 T2 | 8/1997 |
| DE | 10147666 A1 | 4/2003 |
| DE | 102004006266 A1 | 9/2004 |
| DE | 10349309 A1 | 5/2005 |
| DE | 102006019942 A1 | 10/2007 |
| EP | 0638909 A1 | 2/1995 |
| JP | 0529677 | 2/1993 |
| JP | 09321359 | 12/1997 |
| JP | 10144503 | 5/1998 |
| JP | 10275707 | 10/1998 |
| JP | 2004248351 A | 9/2004 |
| JP | 2005150548 A | 6/2005 |
| JP | 2009535610 A | 10/2009 |
| WO | 01/89004 A1 | 11/2001 |
| WO | 2005/043098 A1 | 5/2005 |

* cited by examiner

*Primary Examiner* — Thomas Dougherty
*Assistant Examiner* — Karen B Addison
(74) *Attorney, Agent, or Firm* — McDermott Will & Emery LLP

(57) ABSTRACT

The invention relates to an actuator having a sensor layer by which a temperature can be detected, and to a method for producing the same.

11 Claims, 1 Drawing Sheet

ACTUATOR AND METHOD FOR PRODUCING SAME

TECHNICAL FIELD

The invention relates to an actuator and to a method for producing same.

BACKGROUND

Actuators are used for example in fuel injection systems. Such actuators have a variable-length region having piezoelements which expand or are compressed depending on an applied voltage. In multilayer actuators or piezo-multilayer actuators such as are used in the fuel injection systems, having a layered arrangement of the piezoelements, for example the operating temperature is one aspect which affects the lifetime of this component. In some applications, nevertheless, the temperature is not monitored.

In order to detect an operating range that limits the lifetime or possible incipient damage of the component, it is desirable to monitor the temperature of the component, for example by means of a sensor system.

Temperature sensors thermally coupled to the actuator can be used for temperature monitoring. These separate, non-integrated sensors require additional structural space. Moreover, they are not suitable for detecting the core temperature of the component. Depending on thermal resistances of the materials used and the specific design, the measured temperature can differ significantly from the core temperature of the actuator.

A further possibility for temperature detection comprises determining temperature information from the value of the small-signal capacitance of the actuator. However, this method has only a limited accuracy. Moreover, the measured value is corrupted by the pyroelectric characteristic of the piezoceramic (PZT) material used. Moreover, the linear small-signal measurement required for this type of temperature detection is complicated to combine with the large-signal driving of the actuator, thus giving rise to additional costs for the electronics.

SUMMARY

The problem addressed is that of providing an actuator that is improved in respect of the aspects mentioned above.

The problem is solved by means of an actuator comprising the features of patent claim 1. The actuator comprises a sensor layer, with which a temperature is detectable.

The actuator is an actuator having piezoelements arranged in a layered manner. The expandability and/or compressibility of these elements enables a change in length. The actuator is preferably a multilayer actuator having a plurality of layers or plies, of which one or a plurality of plies are embodied as a sensor layer. The other plies can be expandable and/or compressible as piezoactive layers, serve for the driving thereof or merely have a stabilizing purpose. The sensor with the sensor layer can be embodied as a thermoresistive sensor, for example, in which the temperature detection is detected by means of a temperature-dependent change in resistance. The sensor is integrated into the multilayer construction of the multilayer actuator. Advantageously, these sensor plies or layers have driving that is separate from the actual actuator region in which the piezoelements are arranged.

Such a component enables the additional detection of the ceramic core temperature of the actuator. In comparison with a hybrid solution, that is to say a sensor element coupled to an actuator, the sensor layer integrated in the actuator requires hardly any or virtually no additional space requirement. The sensor layer gives rise to only low additional costs since the temperature sensors can be manufactured largely in the context of a standard piezo process.

The use of the temperature sensor increases the fail-safety of the component by virtue of the fact that hazardous operating states can be identified at an early stage.

Further advantageous configurations of the invention are evident from the dependent patent claims.

The actuator comprises a variable-length region having a plurality of internal electrodes and piezoelements arranged alternately in a layered manner, by means of which the expansion and/or compression of the actuator is made possible. External electrodes, which are electrically conductively connected to the internal electrodes, allow a drive voltage to be applied to the component, said drive voltage controlling the expansion and/or compression.

Furthermore, provision is made of sensor electrodes for making contact with the sensor layer, via which a temperature-dependent value can be read out. For improved detection or as redundancy, further sensor planes can be provided.

In one exemplary embodiment, the sensor layer is structured and comprises a resistive track, the temperature-dependent change in resistance of which is detected. The resistive track can be arranged between two ceramic layers. In one exemplary embodiment, the ceramic layers are produced from the same material as the piezoelements. In an alternative exemplary embodiment, they are produced from a material that is different therefrom.

The resistive track is advantageously metallic. It comprises palladium and/or platinum, for example, which make accurate temperature detection possible.

In one exemplary embodiment, the resistive track is embodied in a meandering manner, such that the resistive track extends over a long length and has a well-defined resistance value.

The method for producing an actuator comprises printing a sensor structure, for example onto a film. The sensor structure is a structured sensor layer that can comprise a resistive track. In a further step, the film on which the sensor structure is printed and further films for forming a variable-length region are grouped to form a stack and the latter is pressed. The stack is subsequently sintered. Apart from the production of the sensor structure, no additional steps are required in comparison with the production of a conventional multilayer actuator, since, with the stacking, the sensor film is integrated into the production process.

DETAILED DESCRIPTION

Figure 1:
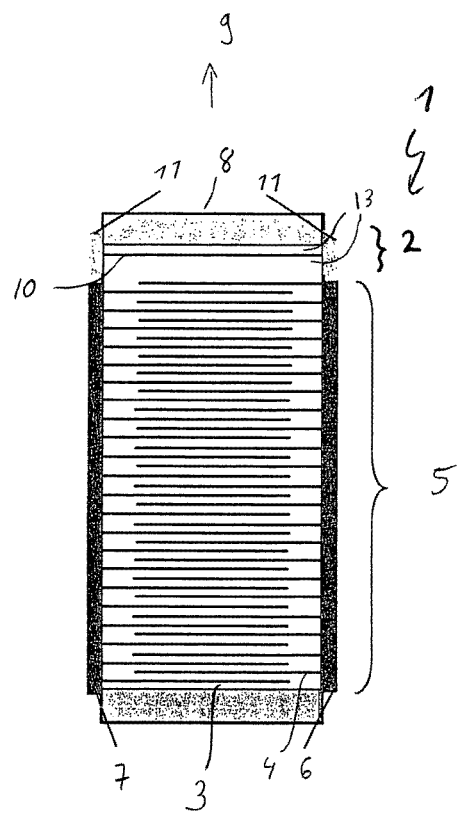
FIG. 1 schematically shows a cross-sectional view through an exemplary embodiment of an actuator.

FIG. 1 schematically shows a cross-sectional view through an exemplary embodiment of an actuator 1 with an integrated temperature sensor 2.

The actuator 1 is a multilayer actuator having a plurality of piezoelements 3 and a plurality of internal electrodes 4. The actuator 1 comprises a region 5 having piezoelements 3 and internal electrodes 4, which are arranged alternately, such that they are layered in a stacked manner. In this case, internal electrodes 4 of a first polarity and internal electrode 4 of a second polarity alternate along the stack. The internal electrodes 4 of the first polarity are electrically conductively connected to a first external electrode 6, for example by being led to an outer side of the actuator stack 8, the external electrode 6 being applied to said outer side. The internal electrodes 4 of the second polarity are electrically conductively connected to a second external electrode 7, for example by being led to another outer side of the stack 8, the external electrode 7 being applied to said outer side. A drive voltage can be applied to the external electrodes 6, 7.

The piezoelements 3 and internal electrodes 4 form layers of the multilayer actuator 1. The piezoelements 3 are formed from a piezoelectric ceramic and change their axial extent when the drive voltage is applied to the internal electrodes 4. The region 5 of the actuator 1, with the piezoelements 3 and the internal electrodes 4 that are electrically conductively connected to the external electrodes 6, 7 is variable in length in an axial direction 9 of the actuator 1.

The actuator 1 comprises one or a plurality of further layers, which are embodied as sensor layers or planes 10 and with which contact is made by sensor electrodes 11. At least one of the sensor electrodes 11 must be electrically isolated from the external electrodes 6, 7, advantageously both, as illustrated in FIG. 1. The sensor layer 10 or the sensor layers 10 can be arranged on the edge side of the variable-length region 5 of the actuator, as illustrated in FIG. 1. Alternatively, one or more sensor layers 10 can be arranged such that on both sides thereof a variable length region 5 is provided; or in other words: the sensor 2 is arranged in the center of the actuator stack 8. In one exemplary embodiment, a plurality of sensor layers 10 are provided, which can be arranged in a manner separated from one another by variable-length actuator regions 5: for example at the edges and in the center of the actuator stack 8. In one exemplary embodiment, a plurality of sensor layers 10 arranged in an adjacent manner are provided.

Figure 2:
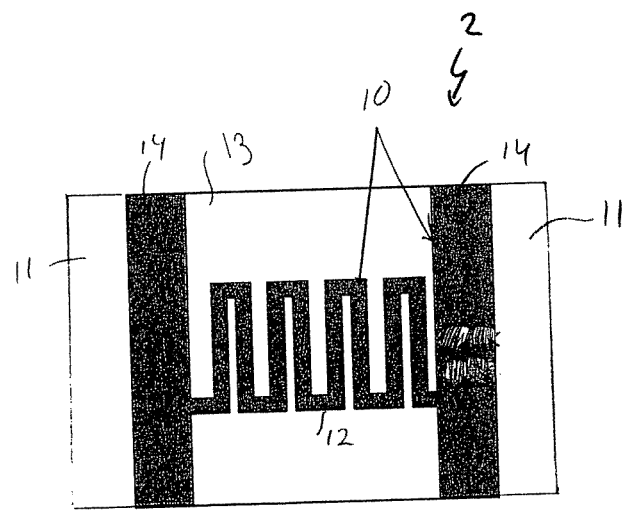
FIG. 2 shows a plan view of a temperature sensor in the actuator.

FIG. 2 shows a plan view of the sensor 2 with its structured sensor layer 10. The sensor 2 is embodied as a thermoelectric sensor 2 and comprises a resistive track 12 having a predefined resistance value, which changes depending on the temperature, and also the sensor electrodes 11. The sensor electrodes 11 can be soldered to contact regions 14 of the sensor layer 10, said contact regions being led toward the outside. The length of the resistive track 12 advantageously exceeds the direct distance between the contact regions 14. This effect is achieved for example by a meandering embodiment of the resistive track 12. The meandering resistive track 12 runs with a plurality of changes in direction between the sensor electrodes 11. It is also conceivable for the width of the resistive track 12 to change along its course, for example to taper.

In one exemplary embodiment, the resistive track 12 is embedded between two ceramic layers 13 composed of piezoceramic (PZT). Preferably, the resistive track 12 is formed from a co-sinterable metal, for example palladium and/or platinum. In one exemplary embodiment, the evaluation of the sensor 2 is effected in a temperature range of −100° C. to 200° C. In this typical temperature range, the change in resistance of the metallic resistive track 12 is largely linearly dependent on the temperature.

In a further exemplary embodiment, the sensor layer 10 is between two layers 13 of a ceramic that differs from that used for the piezoelements 3. However, this ceramic, with regard to production, is compatible with the ceramic used for the piezoelements 3, that is to say that this ceramic can be processed during the production of the actuator 1 in the same way as the ceramic for the piezoelements 3, such that for example no stresses occur between the materials during production.

The actuator 1 can be produced by metallic sensor structures 10 being applied on the planes or films provided for the sensor function. This can take place by means of screen printing, for example. The metallic layers provided for the variable-length region 5 for the formation of the internal electrodes 4 and piezoceramics, which can likewise be present as films, are layered as a stack with the structured films for the sensor 2 and the stack comprising piezo-plies and sensor plies is pressed. The stack with the subsequent variable-length or piezoactive region 5 and the sensor 2 is sintered in one step. As a result of integrated production, a small number of further work steps for the formation of the sensor layer are required only before the stacking.

It should also be noted that the features of the exemplary embodiments can be combined.

REFERENCE SIGNS

1 Actuator
2 Sensor
3 Piezoelement
4 Internal electrode
5 Variable-length region
6, 7 External electrode
8 Stack
9 Axial direction
10 Sensor layer
11 Sensor electrode
12 Resistive track
13 Ceramic layer
14 Contact regions

The invention claimed is:

1. An actuator comprising:
a sensor layer, with which a temperature is detectable,
wherein the sensor layer comprises a resistive track, and
wherein the resistive track is arranged between two ceramic layers.

2. The actuator according to claim 1, further comprising:
a variable-length region comprising a plurality of internal electrodes and piezoelements arranged alternately in a layered manner.

3. The actuator according to claim 1, further comprising:
external electrodes, which are electrically conductively connected to the internal electrodes.

4. The actuator according to claim 1, further comprising:
sensor electrodes for making contact with the sensor layer.

5. The actuator according to claim 1, further comprising:
sensor planes.

6. The actuator according to one of claim 1, wherein the resistive track comprises palladium or platinum.

7. The actuator according to claim 1, wherein the resistive track is embodied in a meandering fashion.

8. An actuator comprising:
a sensor layer, with which a temperature is detectable; and
a variable-length region comprising a plurality of internal electrodes and piezoelements arranged alternately in a layered manner,
wherein the sensor layer comprises a resistive track,
wherein the resistive track is arranged between two ceramic layers, and
wherein the ceramic layers are produced from the same material as the piezoelements or from a material different therefrom.

9. A method for producing an actuator,
wherein the actuator comprises a sensor layer, with which a temperature is detectable, the sensor layer comprising a resistive track, and the resistive track being arranged between two ceramic layers, the method comprising:
printing a sensor structure.

10. The method according to claim 9, further comprising:
stacking a film on which the sensor structure is printed, and further films for forming a variable-length region to form a stack and pressing the stack.

11. The method according to claim 10, wherein the stack is sintered.

* * * * *

UNITED STATES PATENT AND TRADEMARK OFFICE
CERTIFICATE OF CORRECTION

PATENT NO. : 9,252,351 B2
APPLICATION NO. : 13/996482
DATED : February 2, 2016
INVENTOR(S) : Reinhard Gabl et al.

Page 1 of 1

It is certified that error appears in the above-identified patent and that said Letters Patent is hereby corrected as shown below:

IN THE CLAIMS:

In Column 4, Line 45

Replace "according to claim 1", with --according to claim 2--.

In Column 4, Line 52

Replace "according to one of claim 1", with --according to one of claim 1 and claim 8--.

Signed and Sealed this
Nineteenth Day of July, 2016

Michelle K. Lee
*Director of the United States Patent and Trademark Office*